United States Patent

[11] 3,554,162

[72] Inventors Marlo E. Cota
Scottsdale;
James H. Williams, Tempe, Ariz.
[21] Appl. No. 793,030
[22] Filed Jan. 22, 1969
[45] Patented Jan. 12, 1971
[73] Assignee Motorola, Inc.
Franklin Park, Ill.
a corporation of Illinois

[54] DIFFUSION TUBE
5 Claims, 1 Drawing Fig.

[52] U.S. Cl. .......... 118/48
[51] Int. Cl. .......... C23c 11/00
[50] Field of Search .......... 118/48—49.5; 117/(Inquired), 106—107.7; 148/175, 174; 23/(Inquired)

[56] References Cited
UNITED STATES PATENTS

| | | | |
|---|---|---|---|
| 2,817,311 | 12/1957 | Nack .......... | 118/48 |
| 3,098,763 | 7/1963 | Deal et al. .......... | 118/49.5 |
| 3,184,348 | 5/1965 | Marinace .......... | 148/174 |
| 3,189,494 | 6/1965 | Short .......... | 148/174X |
| 3,243,323 | 3/1966 | Corrigan et al. .......... | 148/175 |
| 3,338,761 | 8/1967 | Cheney et al. .......... | 148/175 |
| 3,441,000 | 4/1969 | Burd et al. .......... | 118/49.1 |
| 3,489,621 | 1/1970 | Sirtl .......... | 148/175 |

*Primary Examiner*—Morris Kaplan
*Attorney*—Mueller & Aichele

ABSTRACT: A diffusion tube is described which incorporates an internal seal to prevent the back diffusion of impurity material and the condensation thereof on the input portion of the tube. The tube is provided with an internal baffle plate which is urged into contact with a stop provided on the inner periphery of the tube. The baffle plate contains an aperture to permit the passage of gas therethrough from the input port of the tube. An impurity support is attached to the side of the baffle plate opposite the input port. The impurity source and the semiconductor wafers being processed are inserted in the same end of the diffusion tube. This end is relatively free from condensed impurity material at the completion of the diffusion process due to the combination of the shoulder and the baffle plate. As a result, the processed wafers can be withdrawn from the tube without significant surface contamination.

PATENTED JAN 12 1971 3,554,162
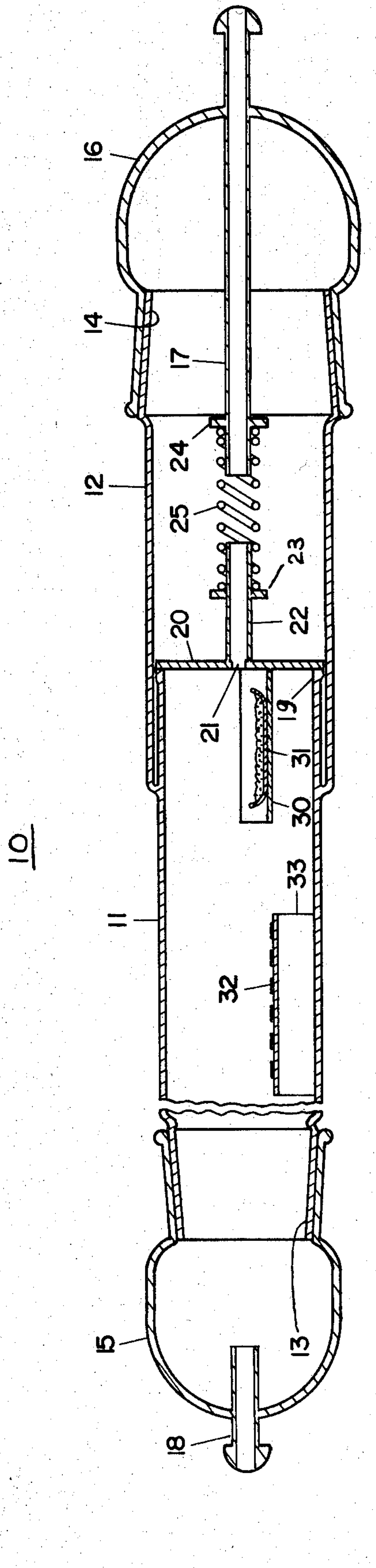
INVENTORS
Marlo E. Cota &
James H. Williams
BY
Mueller, Aichele, & Rauner
Attys

DIFFUSION TUBE

BACKGROUND OF THE INVENTION

This invention relates to diffusion tubes of the type utilized in the diffusion of impurities into semiconductor material from an impurity source at relatively high temperatures. More particularly, the invention relates to a diffusion tube having an internal refractory seal to prevent back diffusion of the impurity material and the redepositing thereof at the input port of the tube.

The widespread commercial usage of semiconductor devices has generated increasing interest in the methods of fabricating and the equipment used in the fabrication of these devices. It is well recognized that in order to utilize the properties of semiconductor material, impurity atoms must be deliberately introduced into the intrinsic semiconductor lattice. The impurity atoms introduced change the electrical characteristics of a pure semiconductor material. Generally, the impurity atoms are introduced into the semiconductor lattice by means of diffusion. As presently practiced in the industry, the diffusion process relies upon subjecting the semiconductor wafer to a vapor state impurity at elevated temperatures. The vapor state atoms penetrate the semiconductor and replace some of the original semiconductor atoms in the atomic structure of the wafer.

Since the characteristics of the resultant device depend strongly upon the impurity level in the wafer and any contaminants contained therein, it is important that the diffusion process by conducted in a relatively clean and controlled environment. In particular, the diffusion apparatus is required to be constructed so that the process can be repeated over and over with the results on successive runs being predictable. This is necessary from a commercial standpoint to insure product uniformity of the final fabricated semiconductor devices.

The diffusion process normally takes place at relatively high temperatures in excess of 1,000° C and consequently, the diffusion chamber and any piece parts associated therewith are normally formed of refractory material. When the wafers are located in the heated chamber, a gas flow containing a desired concentration of impurity atoms contacts the surface of the wafer. The heat permits some of the impurity atoms to penetrate the atomic structure and replace some of the original semiconductor atoms. By adjusting the temperature, the diffusion time, and the concentration of impurity atoms in the gas stream, the doping level and the depth of diffusion can be closely controlled. Due to the fact that the impurity material is in the vapor state, the material has a tendency to deposit in the cool or cooler portions of the diffusion chamber. This deposition is particularly undesirable at the input port of the chamber wherein the wafers are initially inserted and withdrawn. Since the ports of diffusion chambers are provided with standard taper joints which are in practice unsuitable for operating temperatures in excess of a few hundred degrees, the input port of the chamber is normally maintained at a lower temperature than the portion of the diffusion chamber containing the wafers.

Upon the completion of the diffusion process, the wafers are taken from the diffusion chamber and subjected to additional masking or diffusion steps. Since the input port of the tube generally contains deposited impurity material, it is exceedingly difficult to insure that impurity contamination of the surface of the diffused wafer does not occur during the withdrawal from the chamber. As a result, considerable time and effort is required to insure that the wafer surfaces are extremely clean prior to the performance of the next processing step.

SUMMARY OF THE INVENTION

This invention relates to a diffusion chamber wherein the deposition of impurity material at the loading and unloading end or the input port of the diffusion chamber or tube is essentially eliminated. Consequently, surface contamination of the processed wafers due to redeposited impurity material is significantly reduced thereby increasing the yield of the diffusion step. In addition, the removal of redeposited impurity material as a contaminating source has been found to provide improved process uniformity.

A diffusion chamber constructed in accordance with the present invention includes an elongated refractory tube having input and output ports located at the opposing ends thereof. The carrier gas may be introduced into the chamber through the input port along or in combination with carrier gas input means provided in the chamber. The output port is adapted for the passage of carrier gas therethrough and constitutes the exhaust outlet of the chamber. The carrier gas, which is normally inert and takes no active part in the process, is utilized to both purge the system prior to the diffusion process and to carry the impurity material in the vapor state from the impurity port source to the wafers. The wafers and the impurity source are inserted into the chamber through the input port.

The elongated tube is provided with an inwardly extending refractory stop located between the input port and the position of the impurity source. This stop is formed on and extends about the inner periphery of the tube. Further, a refractory baffle plate is inserted through the input port. The dimensions of the baffle plate are chosen so that the baffle plate can engage the stop about the inner periphery of the tube. Thus, the combination of the baffle plate and the stop can provide a releasable seal within the tube.

Also, the baffle plate is provided with a refractory extension rod affixed thereto. This rod extends from the baffle plate toward the input port and cooperates with biasing means which urge the baffle plate into engagement with the stop. As a result, the impurities from the source are no longer free to travel toward the input port and condense on the inner surfaces of the tube proximate to the input port where contamination of the wafer surface has heretofore occurred. This inner seal feature is particularly important due to the fact that the input port is normally at a somewhat cooler or lower temperature than the main section of the diffusion chamber wherein the diffusion process occurs.

In a preferred embodiment of the invention, the extension rod is a hollow tube which is affixed to the baffle plate so as to communicate with an aperture therein. In addition, an elongated refractory feed tube is inserted into the input port. The feed and extension tubes are substantially colinear and form a gap within the chamber. A spring located in the gap and coupled to the adjacent ends of the feed and extension tubes provides the biasing force which urges the baffle plate into engagement with the stop. In operation, the carrier gas in introduced into the chamber through the feed tube and enters the extension tube and passes through the aperture in the baffle plate into the diffusion chamber. Due to the fact that the feed and extension tubes are not fixedly joined, the baffle plate can be located against the tops without regard to any misalignment that might occur between the feed and extension tubes. In other words, the stop formed on the inner periphery of the elongated tube need not reside in a plane which is perpendicular to the axis of the feed tube. This constructional feature of the invention provides an extra degree of freedom in the manufacture of the refractory diffusion chamber.

Since a major problem in the repeated use of a diffusion tube is the obtaining of uniform results in successive runs, the location of the impurity source should remain constant during the successive diffusion operations. Accordingly, support means for an impurity source are located on the baffle plate itself. The support means is formed on the side of the baffle plate facing the output port so that when the baffle plate is urged into engagement with the fixed stop, the location of the impurity source is well defined. In addition, the support means is advantageously located proximate to the aperture in the baffle plate so that the carrier gas flowing through the extension tube and outwardly from the aperture is directed immediately over the surface of the impurity material. Further features and advantages of the invention will become more readily apparent from the following detailed description of a specific embodiment when taken in conjunction with the accompanying drawings.

BRIEF DESCRIPTION OF THE DRAWINGS

The FIG. is a side view in section of a diffusion chamber constructed in accordance with the present invention.

DESCRIPTION OF THE PREFERRED EMBODIMENT

Referring now to the FIG., a diffusion chamber 10, typically 72 inches in length, is shown including first and second tubular sections 11 and 12, respectively. The first section 11 is provided with a standard taper 13 which in turn receives mating end cap 15. End cap 15 contains a centrally located aperture therein which constitutes the output port of the diffusion chamber. The aperture is provided with exhaust tube 18. Similarly, second section 12 is provided with tapered 14. End cap 16 contains a centrally located aperture therein for receiving feed tube 17. All of the aforementioned elements are formed of refractory material, typically quartz.

As shown, first section 11 has a smaller cross-sectional dimension that second section 12 and is inserted into a portion of the second section. The overlying edge of second section 12 is sealed to the outer surface of first section 11. Flange 19 is formed on the inner edge of first section 11 and provides the stop for the adjacently positioned baffle plate 20. Baffle plate 20 contains a centrally located aperture 21 therein which communicates with extension tube 22. The extension tube is formed as an integral part of the baffle plate and contains a flange 23 proximate to its opposing end. The feed tube 17 of end cap 16 contains a similar flange 24 at the end thereof adjacent the extension tube 22. Spring member 25 is located in the gap between tubes and is coupled to the corresponding flanges. The flanges provide the pressure points for the spring.

The baffle plate 20 is provided with an impurity support 30 attached thereto directly beneath the centrally located aperture 21. This support is typically semicircular in shape and is adapted to receive an impurity material boat 31. Thus, the gas flowing through extension tube 22 and aperture 21 passes directly over the impurity material contained in boat 31. The wafers 32 which are to be doped by the impurity material in boat 31 are contained on wafer support 33 and positioned downstream from the impurity source. When the diffusion chamber is heated, carrier gas flowing through extension tube 22 picks up vapor state impurities from boat 31 and conveys them toward semiconductor wafers 32. After passing the wafers, the gas exits through the output port of end cap 15. During the diffusion process, the portion of the assembly 10 containing the wafers is heated to a relatively high temperature, for example of the order of 1,000° to 1,200° C. This heating may be provided by locating the diffusion chamber in a suitable furnace or by surrounding the chamber with a resistive heating apparatus (not shown). Normally the heating apparatus is located so that the impurity source is heated to a temperature which is several hundred degrees lower than the wafers. This depends on the particular impurity source employed and in the case of arsenic troxide the temperature is about 700° C. The particular carrier gas introduced into the system depends upon the type of impurity contained in boat 31 and is normally inert taking no active part in the diffusion process other than the conveying of vapor state impurity atoms to the semiconductor wafers.

The diffusion apparatus is utilized in the following manner, the end cap 16 is removed from second section 12 and the combination of the baffle plate, the impurity support and the extension and feed tubes is withdrawn. The semiconductor wafers on the appropriate wafer support are inserted into the tube and located within first section 11. The impurity material in boat 31 is placed in support 30. The baffle plate and associated tubes are then inserted through the input opening in second section 12 and moved forward toward flange 18. In practice, end cap 16 is fixedly sealed to feed tube 17. This enables the baffle plate and impurity support to be readily moved into loose engagement with flange 18. At this time essentially no compressive force is placed on spring 25. When the baffle plate initially engages the flange, the end cap 16 is then placed on the mating portion of second section 12.

When the end cap 16 is in position on the tapered portion of section 12, the spring 25 is compressed due to the fact that feed tube 17 is an integral attachment to end cap 16. The biasing force provided by spring 25 insures that baffle plate 20 seats against flange 18 about the entire peripheral portion of the chamber. Since there is a gap between feed tube 17 and extension tube 22, the plane of flange 18 need not be normal to the axis of feed tube 17 in order to be properly seated. This aspect of the invention greatly facilitates the manufacture of the diffusion tubes since the tolerances may be relaxed.

In operation, feed tube 17 is fitted or coupled to the carrier gas supply (not shown). The carrier gas flows through tube 17 and fills the portion of second section 12 lying between baffle plate 20 and end cap 16. The pressure of the carrier gas results in the gas entering extension tube 22 flowing through aperture 21 and over the impurity material contained in boat 31. In addition, the pressure of the carrier gas contained in second section 12 results in a positive pressure differential across the junction formed between baffle plate 20 and flange 18 to thereby retard any backward flow of gas and impurity atoms that might occur. Since the diffusion chamber is seated, the impurity material in the vapor state enters the flow of carrier gas and is directed to the wafers 32. The flowing gas then exits through the output port in end cap 15. Due to the fact that baffle plate 20 engages flange 18 about the inner periphery of the diffusion chamber and the positive pressure differential in second section 12 tends to prevent the flow of material into second section 12, the second section is relatively free of impurity atoms and essentially no condensate forms on this portion of the diffusion chamber. The freedom from condensation occurs even when the second section 12 behind baffle plate 20 is intentionally maintained at a lower temperature than first section 11. In practice, the end caps are normally not heated above about 300° C in order to prevent the tapered joint from being permanently locked due to the expansion of the heated parts. Consequently, the removal of the baffle plate structure and the accompanying withdrawal of the semiconductor wafers takes place through a clean portion of the chamber. This has been found to increase the yield of the diffusion process since the surfaces of the withdrawn wafers are less likely to be contaminated. Further, the precise location of the impurity boat 31 is a known and relatively reproducible factor in the process. This further serves to increase the production yield of the aforedescribed diffusion chamber.

In the aforedescribed embodiment, the baffle plate was provided with a central aperture and communicated with an extension tube. However in other embodiments, the carrier gas can be fed directly into the second section of the chamber through suitable input means such as an additional tube in the side of the chamber and the baffle plate need not contain an aperture and the extension tube may be a solid rod. To insure that the flow of impurity material into the portion of the first section of the chamber is minimized, carrier gas is supplied through the feed tube to prevent a substantial reverse pressure differential from occuring across the seal between the stop and baffle plate.

While the above description has referred to a specific embodiment of the invention, it will be recognized that many variations and modifications may be made therein without departing from the spirit and scope of the invention.

We claim:

1. A diffusion chamber of the type utilized in the diffusion of impurities from an impurity source at relatively high temperatures into semiconductor bodies contained therein which comprises:

a. an elongated tube having input and output ports located at the opposing end thereof;
b. means for passing a carrier gas through at least a portion of said elongated tube;
c. an inwardly extending refractory stop provided on and extending continuously around the inner periphery of said tube, said stop being located between the impurity source and the input port;
d. an apertured refractory baffle disposed between said stop and said input port and adapted for engagement with said stop;
e. a refractory extension tube affixed to said baffle plate about said aperture and extending from said baffle plate toward the input port, whereby said carrier gas passes over the impurity source; and
f. biasing means coupled to said rod for urging said baffle plate into engagement with the stop whereby the combination of said baffle plate and stop substantially eliminate the deposition of impurities on the portion of said tube proximate to said input port.

2. The diffusion chamber in accordance with claim 1 wherein said elongated refractory tube includes first and second tubular sections, each having first and second ends, the first end of said sections containing the input and output ports respectively, the second end of said first section having a cross section smaller than the cross section of the second end of the second section, to permit the insertion of a portion of said first section into said second section, the second end of said second section being sealed to the outer surface of said first section, the second end of said first section extending into said first section and forming the stop for the baffle plate.

3. The diffusion chamber in accordance with one of claims 1 further comprising a refractory feed tube located in the input port of said elongated tube, said feed tube being adapted for the passage of gas therethrough, and said biasing means being coupled between said feed tube and extension rod.

4. The diffusion chamber in accordance with claim 3 further comprising support means for an impurity source affixed to said baffle plate, said support means being located on the side of the baffle plate facing the output port.

5. The diffusion chamber in accordance with claim 4 wherein said feed tube and extension tube form a gap therebetween, said biasing means mounted in the gap between tubes and attached thereto to permit withdrawal of the combination of the baffle plate and extension tube by the movement of said feed tube.